United States Patent [19]

Takahashi

[11] Patent Number: 4,943,004
[45] Date of Patent: Jul. 24, 1990

[54] ACTUATOR FOR A FUEL INJECTOR

[75] Inventor: Takeshi Takahashi, Mishima, Japan

[73] Assignee: Toyota Jidosha Kabushiki Kaisha, Japan

[21] Appl. No.: 281,769

[22] Filed: Dec. 9, 1988

[30] Foreign Application Priority Data

Dec. 29, 1987 [JP] Japan .................. 62-335260

[51] Int. Cl.$^5$ ........................................ H01L 41/08
[52] U.S. Cl. .................................. 239/95; 239/128; 239/533.6
[58] Field of Search ............ 239/102.2, 533.12, 533.2, 239/533.3, 533.6, 533.9, 584, 585, 95, 128; 251/129.06, 902; 123/498, 506; 310/328; 267/174, 181

[56] References Cited

U.S. PATENT DOCUMENTS

| | | | |
|---|---|---|---|
| 1,805,600 | 5/1931 | Ross | 267/181 |
| 4,460,842 | 7/1984 | Waanders et al. | 310/328 |
| 4,610,427 | 9/1986 | Igashira et al. | 251/129.06 |
| 4,782,807 | 11/1988 | Takahashi | 123/506 |

FOREIGN PATENT DOCUMENTS 59-206668  11/1984  Japan .
63-1383    1/1988   Japan .

Primary Examiner—Andres Kashnikow
Assistant Examiner—Karen B. Merritt
Attorney, Agent, or Firm—Oliff & Berridge

[57] ABSTRACT

An actuator for a fuel injector, including a hollow cylindrical spring member, one end of the hollow cylindrical spring member being supported by the actuator housing, the other end of the hollow cylindrical spring member forming a piston slidably inserted into the cylinder bore of the actuator housing and defining a cylinder chamber, wherein a piezoelectric element is inserted into the hollow cylindrical spring member and is supported between the actuator housing and the hollow cylindrical spring member.

26 Claims, 5 Drawing Sheets

ACTUATOR FOR A FUEL INJECTOR

BACKGROUND OF THE INVENTION

1. Field of the Invention

The present invention relates to an actuator for a fuel injector of an engine of an automobile.

2. Description of the Related Art

Known in the art is an actuator for a fuel injector whereby the fuel injector is controlled by operating a piston through a piezoelectric element, to change the pressure in a cylinder chamber defined by the piston. In such a known actuator for a fuel injector, the piston is pre-loaded, for example, as disclosed in Japanese Unexamined Patent Publication (Kokai) No. 59-206668, by providing a flat spring or other form of compression spring inside the cylinder chamber.

However, if a flat spring or coil spring is used to pre-load the piston, an offset load will be imposed on the piezoelectric element, and as a result, the problems of damage to the piezoelectric element and of an increase in the number of components will arise.

SUMMARY OF THE INVENTION

An object of the present invention is to provide an actuator for a fuel injector which will not impose an offset load on the piezoelectric element.

According to the present invention, there is provided an actuator for a fuel injector including an actuator housing having a cylinder bore formed therein; a hollow cylindrical spring member, one end of which is supported by the actuator housing and the other end of which forms a piston slidably inserted into the cylinder bore and defining a cylinder chamber in the cylindrical bore; and a piezoelectric element provided in the hollow cylindrical spring member and supported between the actuator housing and the other end of the hollow cylindrical spring member.

The present invention may be more fully understood from the description of a preferred embodiment of the invention set forth below, together with the accompanying drawings.

DESCRIPTION OF THE PREFERRED EMBODIMENTS

Figure 4:
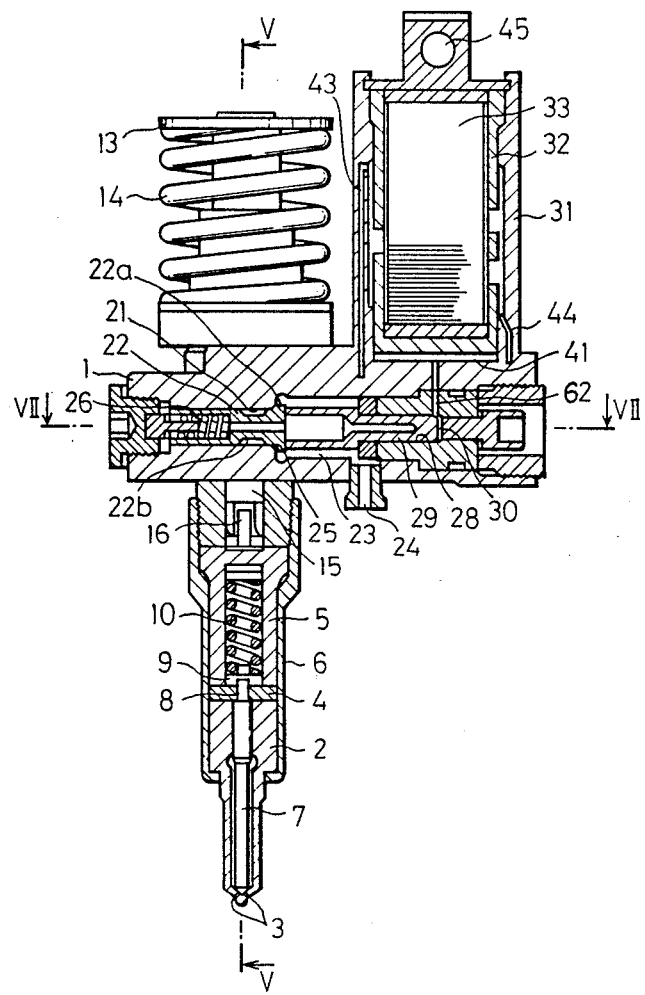
FIG. 4 is a side sectional view of a fuel injector taken along the line IV—IV of FIG. 5.
Figure 5:
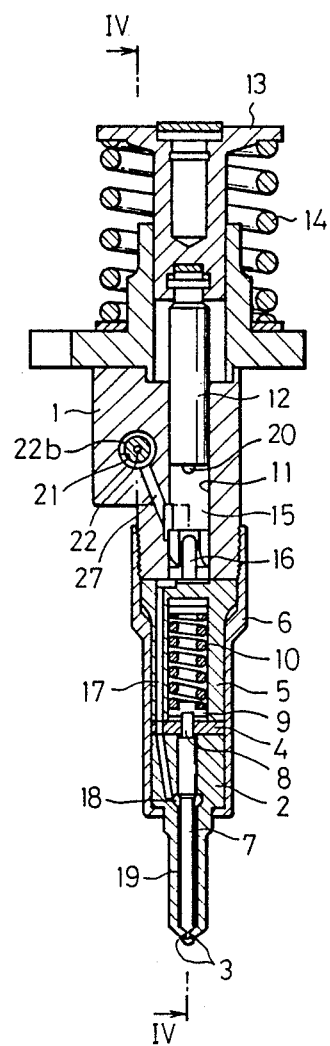
FIG. 5 is a side sectional view taken along the line V—V of FIG. 4.
Figure 6:
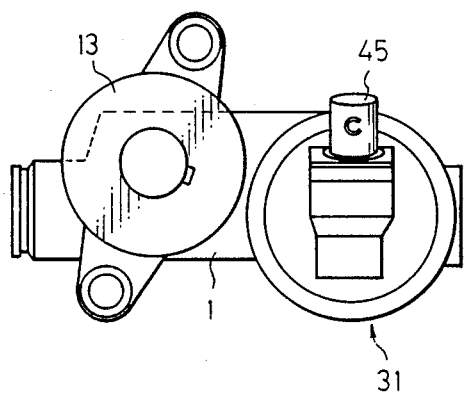
FIG. 6 is a plan view of FIG. 4.

Referring to FIG. 4, FIG. 5 and FIG. 6, reference numeral 1 indicates a housing body of a unit injector, 2 is a nozzle having a nozzle opening 3 at the end thereof, 4 is a spacer, 5 is a sleeve, and 6 is a nozzle holder for mounting the nozzle 2, spacer 4, and sleeve 5 to the housing body 1. A needle 7 is slidably inserted in the nozzle 2, to open and close the nozzle opening 3, and the top of the needle 7 is connected to a spring retainer 9 via a pressure pin 8. The spring retainer 9 is biased downward by a compression spring 10 and this bias force is exerted on the needle 7 through the pressure pin 8, and thus the needle 7 is biased by the compression spring 10 to close the opening 3.

On the other hand, a plunger bore 11 is formed in the housing body 1 coaxially with the needle 7, and a plunger 12 is slidingly inserted in this plunger bore 11. The top end of the plunger 12 is connected to a tappet 13 which is biased upward by a compression spring 14. This tappet 13 is moved up and down by an engine driven cam (not shown), and accordingly, the plunger 12 is moved up and down in the plunger bore 11. On the other hand, a high pressure fuel chamber 15 defined by the plunger 12 is formed in the plunger bore 11 under the plunger 12. This high pressure fuel chamber 15 is connected to a pressurized fuel reservoir 18 via a rod filter 16 and a fuel passage 17, and the pressurized fuel reservoir 18 is connected to the nozzle opening 3 through an annular fuel passage 19 around the needle 7. Further, the inner wall of the plunger bore 11 is provided with a fuel supply port 20 which supplies fuel to the high pressure fuel chamber 15 at a pressure of about 3 kg/cm$^2$ when the plunger 12 is in the upper position, as shown in FIG. 5.

A bore 21 is formed in the housing body 1 and extends perpendicular to the axis of the plunger bore 11, to hold a spill valve 22. A fuel spill chamber 23 is formed adjacent to the bore 21 having a diameter larger than that of the bore 21. Fuel is supplied to the fuel spill chamber 23 from a fuel supply port 24. The fuel pressure in the fuel spill chamber 23 is maintained at about 3 kg/cm$^2$. The spill valve 22 is provided with an enlarged head portion 22a and a circumferential groove 22b formed adjacent to the enlarged head portion 22a, and the enlarged head portion 22a serves to open and close a valve port 25. The spill valve 22 is biased to the right in FIG. 4 by a compression spring 26 positioned opposite to the enlarged head portion 22a. Further, a fuel spill passage 27 is formed in the housing body 1 and extends upward in the radial direction from the high pressure fuel chamber 15, as shown in FIG. 5. One end of the fuel spill passage 27 is communicated with the inside of the high pressure fuel chamber 15, and the other end of the fuel spill passage 27 is communicated with the inside of the circumferential groove 22b of the spill valve 22.

A rod bore 28 is formed in the housing body 1 coaxially with the bore 21, and a rod 29 is slidably inserted therein. One end of the rod 29 is able to abut against the enlarged head portion 22a of the spill valve 22, and the other end of the rod 29 defines a pressure control chamber 30.

Figure 1:
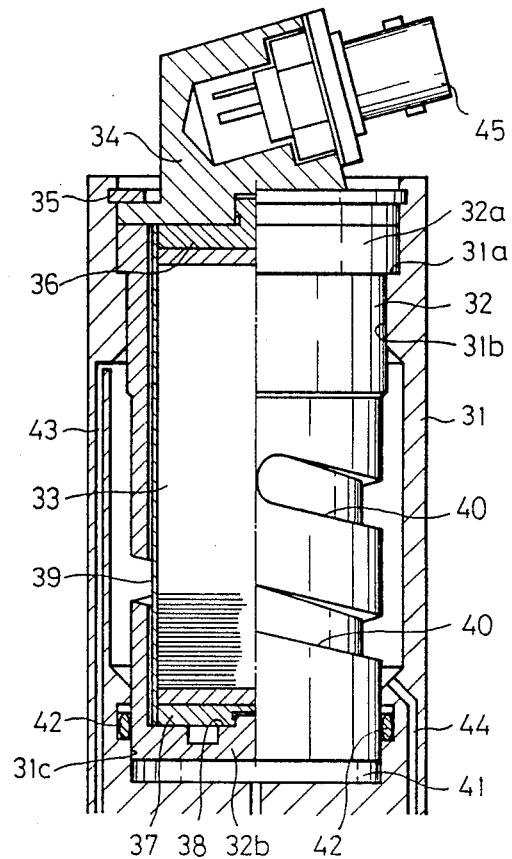
FIG. 1 is a side sectional view of an actuator for a fuel injector.

An actuator housing 31 is formed integrally with the housing body 1, and contains a cup-shaped hollow cylindrical spring 32 holding a piezoelectric element 33 composed of a stack of laminated piezoelectric plates. As shown in FIG. 1, the hollow cylindrical spring 32 has a large diameter top portion 32a which is fitted into the actuator housing 31 from the top thereof to abut against a shoulder 31a formed on the inside wall of the actuator housing 31. A cap 34 is fitted on the top of the hollow cylindrical spring 32, and the hollow cylindrical spring 32 and the cap 34 are fixed to the actuator housing 31 by a clip 35. The top of the piezoelectric element 33 is supported by the actuator housing 31 through an insulating plate 36 and the cap 34, and the bottom thereof is supported by the inside bottom wall 38 of the hollow cylindrical spring 32 through an insulating plate 37. Further, the outer circumference of the piezoelectric element 33 is covered by an insulating film 39.

Figure 2:
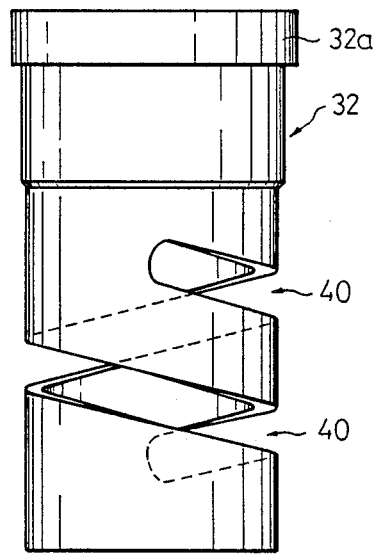
FIG. 2 is a side sectional view of a hollow cylindrical spring.

As shown in FIG. 1 and FIG. 2, a spiral slit 40 is formed at the middle portion of the hollow cylindrical spring 32, which is formed from a metal material. The spiral slit 40 is provided to impart a suitable elasticity to the hollow cylindrical spring 32.

Figure 3:
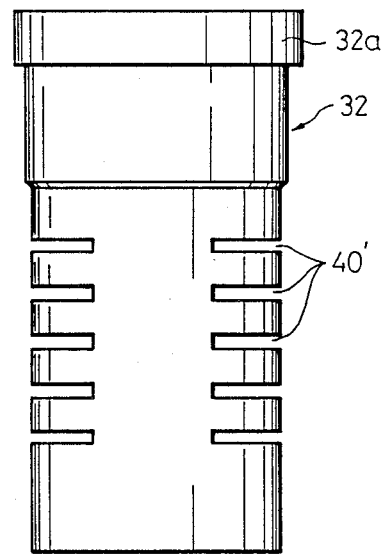
FIG. 3 is a side view of another example of the hollow cylindrical spring.

In another example of the hollow cylindrical spring 32 shown in FIG. 3, a plurality of slits 40' are formed to extend for about one-third of the circumference of the middle portion of the hollow cylindrical spring 32, and thus the hollow cylindrical spring 32 is provided with a suitable elasticity. Referring again to FIG. 1, the upper portion of the hollow cylindrical spring 32 is inserted in an upper guide bore 31b of the actuator housing 31, and the lower portion 32b of the hollow cylindrical spring 32 is slidably inserted into a lower cylinder bore 31c of the actuator housing 31 and defines a cylinder chamber 41 in the lower cylinder bore 31c. A seal ring 42 is inserted between the lower cylinder bore 31c and the bottom 32b of the hollow cylindrical spring. When the hollow cylindrical spring 32 and the piezoelectric element 33 are fitted into the actuator housing 31, the hollow cylindrical spring 32 is slightly expanded to provide a pre-load on the piezoelectric element 33. When the piezoelectric element 33 is charged, the bottom 32b of the hollow cylindrical spring 32 moves downward, and as a result, the volume of the cylinder chamber 31 is reduced. Therefore, the bottom 32b of the hollow cylindrical spring 32 acts as a piston to control the volume of the cylinder chamber 41.

The cylinder chamber 41 is filled with fuel and, as shown in FIG. 4, is connected with the pressure control chamber 30 through a fuel passage 62. The actuator housing 31 is provided with a cooling liquid supply passage 43 and a cooling liquid discharge passage 44 for leading a cooling liquid, for example, fuel, around the piezoelectric element 33. The cooling liquid, for example, fuel, is led around the hollow cylindrical spring 32 from the cooling liquid supply passage 43, flows into the slit 40, cools the piezoelectric element 33, and is discharged from the cooling liquid discharge passage 44. A plug 45 is attached to the cap 34 mounted at the top of the actuator housing 31 for supplying power to the piezoelectric element 33.

Figure 7:
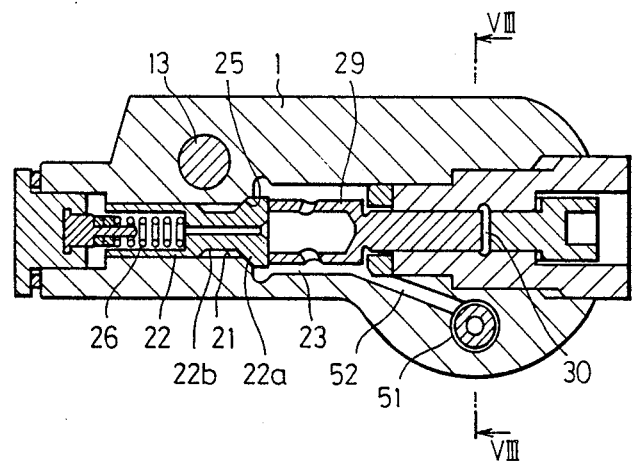
FIG. 7 is a sectional view taken along line VII—VII of FIG. 4.
Figure 8:
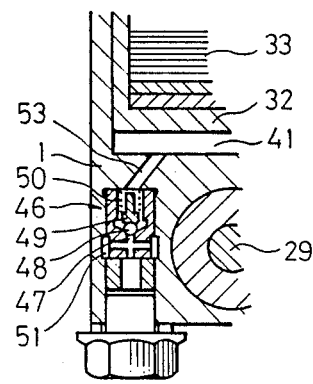
FIG. 8 is sectional view taken along line VIII—VIII of FIG. 7.

As shown in FIG. 7 and FIG. 8, a check valve 46 is inserted in the housing body 1. This check valve 46 is provided with a ball 48 for opening and closing a valve port 47, a rod 49 for restricting the amount of lift of the ball 48, and a compression spring 50 for biasing the ball 48 and rod 49 downward, and therefore, the valve port 47 is normally closed by the ball 48. The valve 47 of the check valve 46 is communicated with the fuel spill chamber 23 through an annular fuel inflow passage 51 and a fuel inflow passage 52. A fuel outflow passage 53 of the check valve 46 is connected to the inside of the cylinder chamber 41. As mentioned earlier, the fuel pressure in the fuel spill chamber 23 is maintained at about 3 kg/cm². When the fuel pressure in the cylinder chamber 41 becomes lower than the fuel pressure in the fuel spill chamber 23, the check valve 46 opens and additional fuel is supplied to the cylinder chamber 41. Therefore, the cylinder chamber 41 is always filled with fuel.

As mentioned earlier, when the plunger 12 is in the upper position, fuel is supplied to the high pressure fuel chamber 15 from the fuel supply port 20, and therefore, the high pressure fuel chamber 15 has a low inner pressure of about 3 kg/cm². On the other hand, the piezoelectric element 33 is under a maximum contraction, and the fuel pressure in the cylinder chamber 41 and the pressure control chamber 30 is a low pressure of about 3 kg/cm². Therefore, the spill valve 22 is moved to the right in FIG. 4 by the force of the compression spring 26 and the enlarged head portion 22a of the spill valve 22 opens the valve port 25 and accordingly, the fuel pressure in the fuel spill passage 27 and the circumferential groove 22b of the spill valve 22 also becomes a low pressure of about 3 kg/cm².

Next, the plunger 12 descends and closes the fuel supply port 20, but the spill valve 22 opens the valve port 25, so that fuel in the high pressure fuel chamber 15 flows out through the fuel spill passage 27, the circumferential groove 22b of the spill valve 22, and the valve port 25 to the fuel spill chamber 23. Therefore, at this time, the fuel pressure in the high pressure fuel chamber 15 becomes a low pressure of about 3 kg/cm².

Then, when a charge is given to the piezoelectric element 33 to start the fuel injection, the piezoelectric element 33 expands in the axial direction, and as a result, the hollow cylindrical spring 32 is expanded, and thus the fuel pressure in the cylinder chamber 41 and the pressure control chamber 30 is rapidly increased. When the fuel pressure in the pressure control chamber 30 is increased, the rod 29 is moved to the left in FIG. 4, whereby the spill valve 22 is also moved to the left and the enlarged head portion 22a of the spill valve 22 closes the valve port 25. When the valve port 25 is closed by the plunger 12, the fuel pressure in the high pressure fuel chamber 15 is rapidly increased, and when the fuel pressure in the high pressure fuel chamber 15 exceeds a predetermined pressure, for example, 1500 kg/cm² or more, the needle 7 opens the nozzle opening 3 and a fuel injection is carried out. At this time, a high pressure is also applied to the circumferential groove 22b of the spill valve 22 through the fuel spill passage 27, but the pressure receiving areas of the two axial direction end surfaces of the circumferential groove 22b are equal, and thus this high pressure does not act on the spill valve 22.

Next, when the piezoelectric element 33 is discharged to stop the fuel injection, the piezoelectric element 33 is contracted, and as a result, the hollow cylindrical spring 32 is contracted under its own spring force and thus the fuel pressure in the cylinder chamber 41 and the pressure control chamber 30 is lowered. When the fuel pressure in the pressure control chamber 30 is lowered, the rod 29 and spill valve 22 are moved to the right in FIG. 4 by the compression spring 26, and thus the enlarged head portion 22a of the spill valve 22 opens the valve port 25. As a result, the high pressure fuel in the high pressure fuel chamber 15 flows through the fuel spill passage 27, the circumferential groove 22b of the spill valve 22, and the valve port 25 to the fuel spill chamber 23, and thus the fuel pressure inside the high pressure fuel chamber 15 immediately drops to a low pressure of about 3.0 kg/cm², the needle 7 closes the nozzle opening 3, and the fuel injection is stopped. The plunger 12 then returns to the upper position.

Therefore, according to the present invention, the hollow cylindrical spring 32 acts as a piston, and thus, other springs in addition to the piston become unnecessary and the number of components can be reduced. Further, if a hollow cylindrical spring 32 is used, a uniform load is imposed on the bottom surface of the piezoelectric element 33, and thus there is no danger of damage to the piezoelectric element 33 by an offset load. Further, the spring length of the hollow cylindrical spring 32 is long, and therefore, even if a manufacturing difference exists in the hollow cylindrical spring 32, an advantage is obtained in that a precise preloading of the piezoelectric element 33 can be carried out.

Although the invention has been described with reference to a specific embodiment chosen for purposes of illustration, it should be apparent that numerous modifications could be made thereto by those skilled in the art without departing from the basic concept and scope of the invention.

I claim:

1. An actuator for a fuel injector, comprising:
an actuator housing having a cylinder bore formed therein;
a hollow cylindrical spring member, one end of which is supported by the actuator housing and another end of which forms a piston slidably inserted into the cylinder bore and defining a cylinder chamber in the cylinder bore, said spring member including a first surface, said cylinder bore including a second surface, said first and second surfaces engaging one another and preventing said one end of the cylindrical spring member from moving toward said another end; and
a piezoelectric element inserted into the hollow cylindrical spring member and supported between the actuator housing and the other end of the hollow cylindrical spring member.

2. An actuator according to claim 1, wherein said one end of said hollow cylindrical spring member is enlarged outwardly to form said first surface, said first surface engaging said second surface and being supported by the actuator housing.

3. An actuator according to claim 2, wherein said actuator housing is provided with a guide bore to form said second surface, said guide bore arranged adjacent to said first surface of the hollow cylindrical spring member and said hollow cylindrical spring member is guided by said guide bore.

4. An actuator according to claim 1, wherein said hollow cylindrical spring member has a slit which passes through a wall of said hollow cylindrical spring member, said slit providing said hollow cylindrical spring member with an appropriate elasticity.

5. An actuator according to claim 4, wherein said slit is in the form of a spiral extending along the outer circumference of said hollow cylindrical spring member.

6. An actuator according to claim 4, wherein said slit is composed of a plurality of slits separated from each other in the axial direction of said hollow cylindrical spring member and extending in the circumferential direction of said hollow cylindrical spring member.

7. An actuator according to claim 1, wherein a seal ring is inserted between said piston and said cylinder bore.

8. An actuator according to claim 1, wherein an annular cooling medium passage is formed around said hollow cylindrical spring member.

9. A fuel injector using an actuator according to claim 1, said fuel injector comprising a fuel injector housing having a nozzle bore; a plunger reciprocatively movable in said fuel injector housing; and a high pressure fuel chamber formed in the fuel injector housing and defined by said plunger, the pressure of fuel in the high pressure fuel chamber being increased by the plunger; and further comprising a needle arranged to be substantially aligned with the said plunger in the fuel injector housing and opening the nozzle bore to inject fuel in the high pressure fuel chamber from the nozzle bore when a pressure of fuel in the high pressure fuel chamber exceeds a predetermined pressure; a fuel spill passage formed in said fuel injector housing and connected to the high pressure fuel chamber; a spill valve arranged in the fuel spill passage and slidably inserted into a bore formed in the fuel injector housing; said actuator driving said spill valve and opening said spill fuel passage when a fuel injection operation is to be stopped and closing the spill fuel passage when a fuel injection operation is to be carried out.

10. A fuel injector according to claim 9, wherein said fuel injector housing has a pressure control chamber formed therein coaxially with the axis of said spill valve, the pressure in said pressure control chamber is controlled by said actuator, and said spill valve is controlled by the pressure in said pressure control chamber.

11. A fuel injector according to claim 10, wherein a fuel spill chamber is formed between said spill valve and said pressure control chamber, said bore opening into the said fuel spill chamber and having a valve port connected to said high pressure fuel chamber through said fuel spill passage, and said valve port being opened and closed by the spill valve.

12. A fuel injector according to claim 11, wherein said spill valve is provided with an enlarged head portion which is located in said fuel spill chamber and opens and closes said valve port and a circumferential groove positioned in said bore adjacent to said enlarged head portion, said circumferential groove being connected to said high pressure fuel chamber through said fuel spill passage and said circumferential groove, when said enlarged head portion opens said valve port is open to said fuel spill chamber.

13. A fuel injector according to claim 10, wherein a rod is inserted between said spill valve and said pressure control chamber and a pressure in said pressure control chamber is applied to said spill valve through said rod.

14. A fuel injector according to claim 10, wherein said spill valve is spring-biased toward said pressure control chamber.

15. A fuel injector according to claim 10, wherein said pressure control chamber is connected to the inside of the cylinder chamber of said actuator and the pressure in said pressure control chamber is controlled by the pressure in said cylinder chamber.

16. A fuel injector according to claim 10, wherein said pressure control chamber, said cylinder chamber, and said hollow cylindrical spring member are arranged on a common axis.

17. A fuel injector according to claim 10, wherein said cylinder chamber and said pressure control chamber are filled with fuel.

18. A fuel injector according to claim 10, wherein a fuel spill chamber is formed between said spill valve and said pressure control chamber and said fuel spill chamber is connected to said cylinder chamber through a check valve allowing communication only from said fuel spill chamber to said cylinder chamber.

19. An actuator, comprising:
an actuator housing having a cylinder bore formed therein;
a hollow cylindrical spring member, one end of which is supported by the actuator housing and another end of which forms a piston slidably inserted into the cylinder bore and defining a cylinder chamber in the cylinder bore, said spring member including a first surface, said cylinder bore including a second surface, said first and second surfaces engaging one another and preventing said one end of the cylindrical spring member from moving toward said another end; and
a piezoelectric element inserted into the hollow cylindrical spring member and supported between the actuator housing and the other end of the hollow cylindrical spring member.

20. An actuator according to claim 19, wherein said one end of said hollow cylindrical spring member is enlarged outwardly to form said first surface, said first surface engaging said second surface and being supported by the actuator housing.

21. An actuator according to claim 20, wherein said actuator housing is provided with a guide bore to form said second surface, said guide bore arranged adjacent to said first surface of the hollow cylindrical spring member and said hollow cylindrical spring member is guided by said guide bore.

22. An actuator according to claim 19, wherein said hollow cylindrical spring member has a slit which passes through a wall of said hollow cylindrical spring member, said slit providing said hollow cylindrical spring member with an appropriate elasticity.

23. An actuator according to claim 22, wherein said slit is in the form of a spiral extending along the outer circumference of said hollow cylindrical spring member.

24. An actuator according to claim 22, wherein said slit is composed of a plurality of slits separated from each other in the axial direction of said hollow cylindrical spring member and extending in the circumferential direction of said hollow cylindrical spring member.

25. An actuator according to claim 19, wherein a seal ring is inserted between said piston and said cylinder bore.

26. An actuator according to claim 19, wherein an annular cooling medium passage is formed around said hollow cylindrical spring member.

* * * * *